United States Patent [19]
Harada

[11] 3,993,960
[45] Nov. 23, 1976

[54] MAGNETIC SIGNAL MIXING AMPLIFIER

[75] Inventor: Koosuke Harada, Fukuoka, Japan

[73] Assignee: Seibu Denki Kogyo Co., Ltd., Fukuoka, Japan

[22] Filed: June 2, 1975

[21] Appl. No.: 582,802

Related U.S. Application Data

[63] Continuation of Ser. No. 480,248, June 17, 1974, abandoned, which is a continuation of Ser. No. 297,674, Oct. 16, 1972, abandoned.

[52] U.S. Cl. .............................. 330/63; 331/113 A
[51] Int. Cl.$^2$ ........................................... H03F 9/00
[58] Field of Search ............... 330/8, 63; 331/113 A

[56] References Cited
UNITED STATES PATENTS

| | | | |
|---|---|---|---|
| 3,026,486 | 3/1962 | Pintell | 331/113 A |
| 3,176,243 | 3/1965 | Meir | 331/113 A |
| 3,199,011 | 8/1965 | Sikorra | 331/113 A X |
| 3,211,920 | 10/1965 | Nelson | 331/113 A X |

Primary Examiner—James B. Mullins
Attorney, Agent, or Firm—Brisebois & Kruger

[57] ABSTRACT

Magnetic signal mixing amplifier comprises a saturable core having a rectangular magnetization characteristic, at least one D.C. input winding, and a D.C. driven oscillator connected to receive the output, said amplifier being supplied with an asymmetrical waveform so that a difference between the mean values of the positive and negative halfwaves of the oscillatory output results.

2 Claims, 7 Drawing Figures $E_D = 15V$
$R_B = 1.5K\Omega$
$R_L = 20\Omega$
$R_L' = 1K\Omega$
$C = 47\mu F$

MAGNETIC SIGNAL MIXING AMPLIFIER

This is a continuation, of application Ser. No. 480,248 filed June 17, 1974, abandoned, which was a continuation of application Ser. No. 297,674, filed Oct. 16, 1972, abandoned.

SUMMARY OF THE INVENTION

This invention relates to a new type of magnetic signal mixing amplifier, particularly to a magnetic signal mixing amplifier which is useful for the treatment of multi-signals at different levels of potential.

In the prior art in the present field, it is known that while conventional magnetic amplifiers are suitable for adding and amplifying multi-signals from signal sources having respectively different potential levels, these conventional amplifiers have a slow response and require an A.C. voltage supply. Accordingly, it is the primary object of the present invention to provide a magnetic signal mixing amplifier which takes only a short time to respond to the signal and which can be operated with a D.C. supply.

Another object of the present invention is to provide a magnetic signal mixing amplifier in which the magnetomotive force obtained in its saturable core is used as its input and its output voltage shows excellent linearity in proportion thereto.

A still further object of the present invention is to provide a magnetic signal-mixing amplifier which is highly effective in the detection and measurement of high-power D.C. when used as a D.C. transformer.

Other objects and advantages of the invention will become apparent from a study of the following specification when considered in the light of the accompanying drawings in which.

The magnetic signal-mixing amplifier of the present invention basically consists of at least one input winding and an oscillator comprising a saturable core and switching transistors. The input magnetomotive force produces a difference between the mean values of the positive and the negative half wave of the A.C. oscillatory voltage obtained at the output side of the mixing amplifier.

Figure 1:
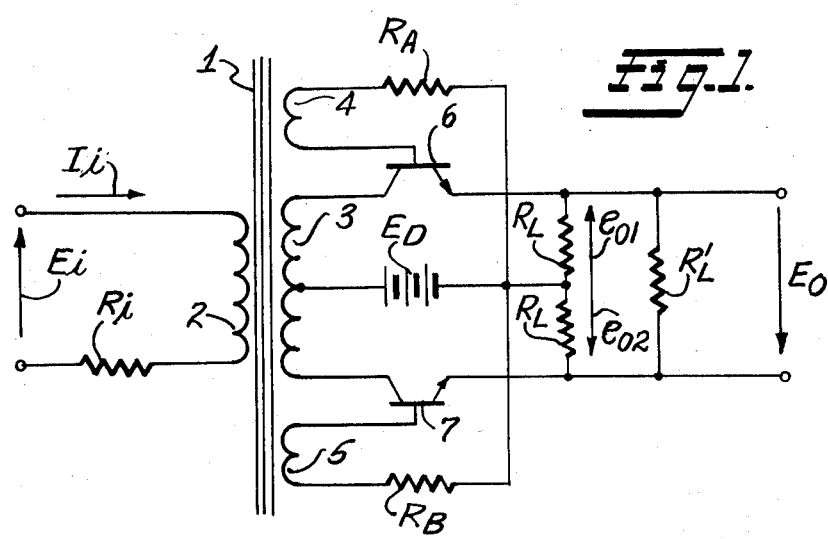
FIG. 1 is a diagram showing a single core circuit of a magnetic signal mixing amplifier.

Referring first to FIG. 1, this shows the basic circuit of a single core amplifier according to the present invention. Magnetic core 1 forms the closed magnetic circuit of the saturable reactor and is made of a material having a rectangular magnetization characteristic such as Permalloy or Ferrite. Reference numeral 2 indicates one of the input windings, to which the input current Ii is supplied through the input resistance Ri. In order to have the oscillation of rectangular wave form windings 3, 4 and 5 are connected with the D.C. source $E_D$, and the transistors 6 and 7. Output Eo can be detected across the terminals of resistance $R'_L$ as the difference between the voltage $e_{01}$ and $e_{02}$ generated across dummy resistances $R_L$.

Figure 2:
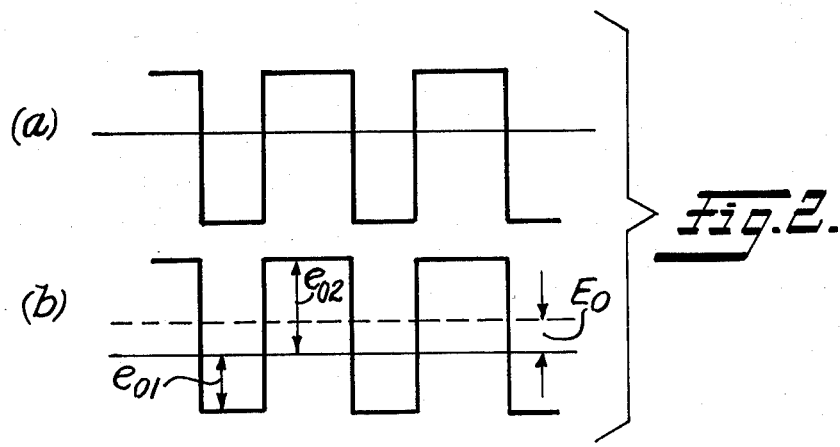
FIGS. 2A and 2B are diagrams showing the performance of the circuit of FIG. 1 and idealized wave form of the voltage in the circuit of FIG. 1.

The idealized voltage wave form in FIG. 2A shows the induced voltage generated across the terminals of the input winding 2. In this case an asymmetrical wave form is generated by the magnetomotive force of the input Ii. FIG. 2B shows the wave form of the output voltage. At the output side, another asymmetrical wave form appears, so that the D.C. component of the output voltage may be produced in proportion to the input.

Figure 3:
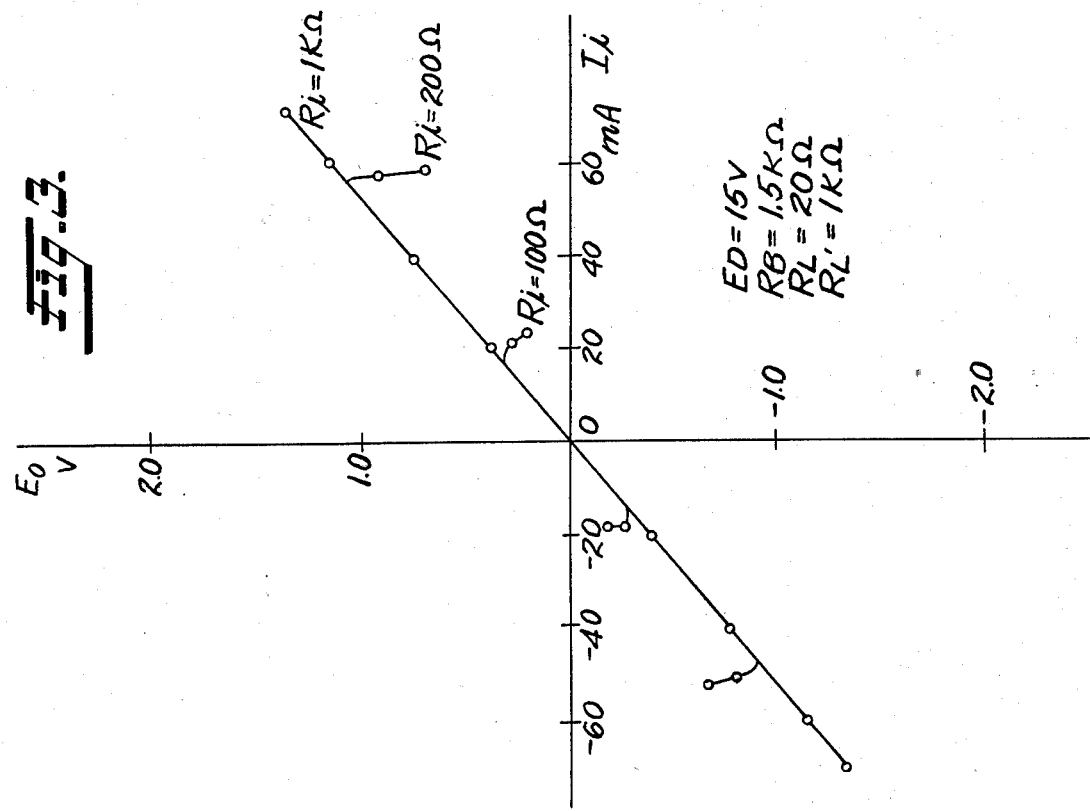
FIG. 3 is a graph showing the result of an experiment as to the relationship between input current Ii and the output voltage, with resistance Ri.

From the experiment illustrated in FIG. 3 which shows the relationship between the input current Ii and the output voltage Eo, taking for an input resistance Ri, it will be recognized that the magnetic signal-mixing amplifier of FIG. 1 is quite excellent in linearity. However, it should be understood that the possible range of operation may be limited when the input resistance Ri is too small. This occurs because the smaller the input resistance Ri becomes, the more the loading as an oscillator increases and stability of oscillation becomes poor.

Figure 4:
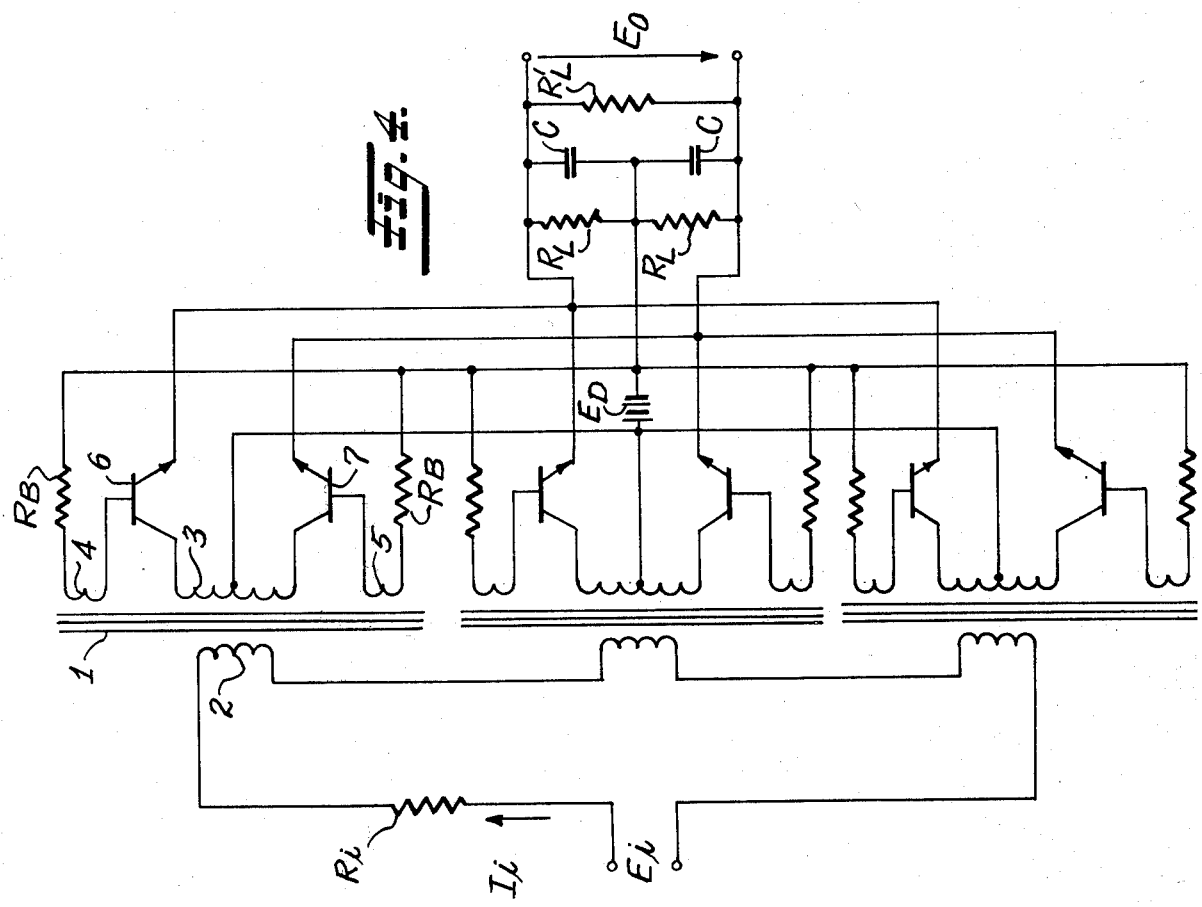
FIG. 4 is a diagram showing a three phase configuration of the magnetic signal-mixing amplifier.

So as to avoid the above-mentioned unstable oscillation, it is effective to adopt the three-phase configuration shown in FIG. 4. This configuration is a combination of three basic circuits as shown in FIG. 1 and three input windings connected in series, with a d.c. supply voltage and the load being common to each circuit. The oscillation voltages cancel each other in the control circuits of the said three oscillators, so that the impedance Ri of the input circuit may be small. In this case a three-phase oscillation takes place. Therefore, stability of the oscillator is almost independent of the input impedance Ri, since the induced voltage is cancelled out on each input winding.

Figure 5:
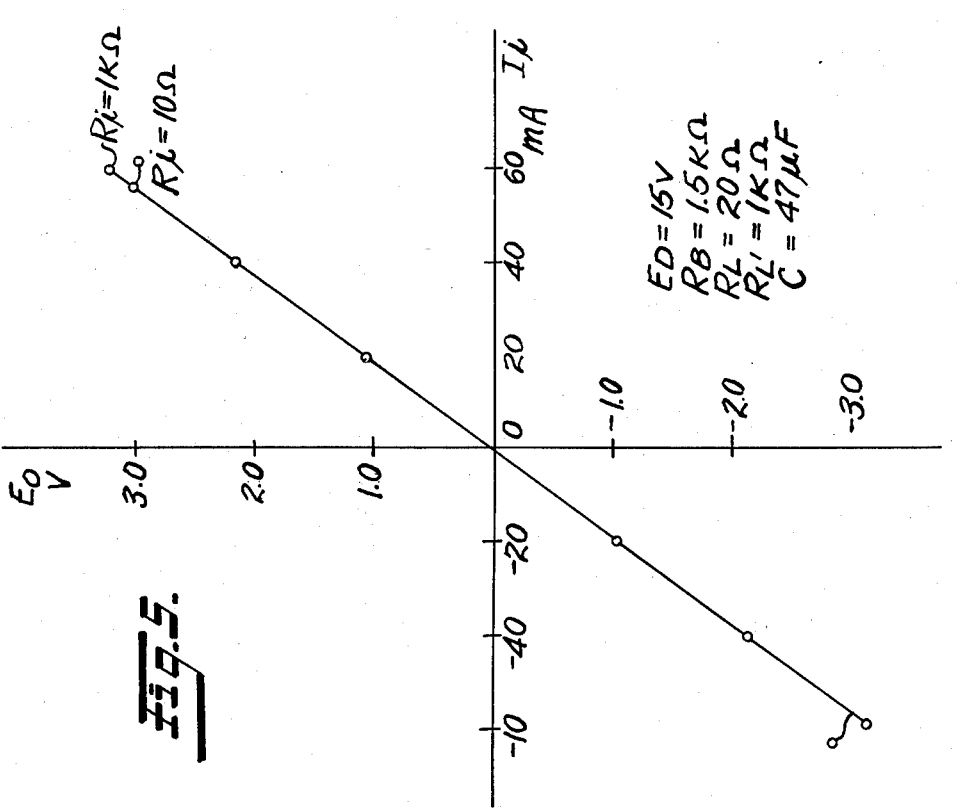
FIG. 5 is a graph showing the result of an experiment similar to that of FIG. 3 using the three-phase configuration of FIG. 4.

From the result of the experiment shown in FIG. 5, it will be evident that the range of operation is hardly influenced by the input impedance Ri. Thus, with the three-phase configuration, the limitation on the input impedance will be removed.

Figure 6:
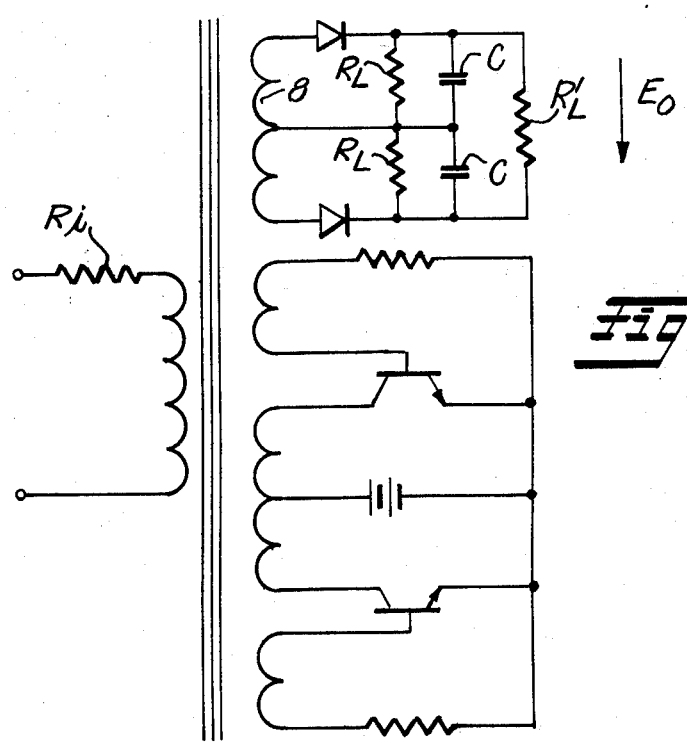
FIG. 6 is a diagram showing an isolated single core circuit of the invention.
Figure 7:
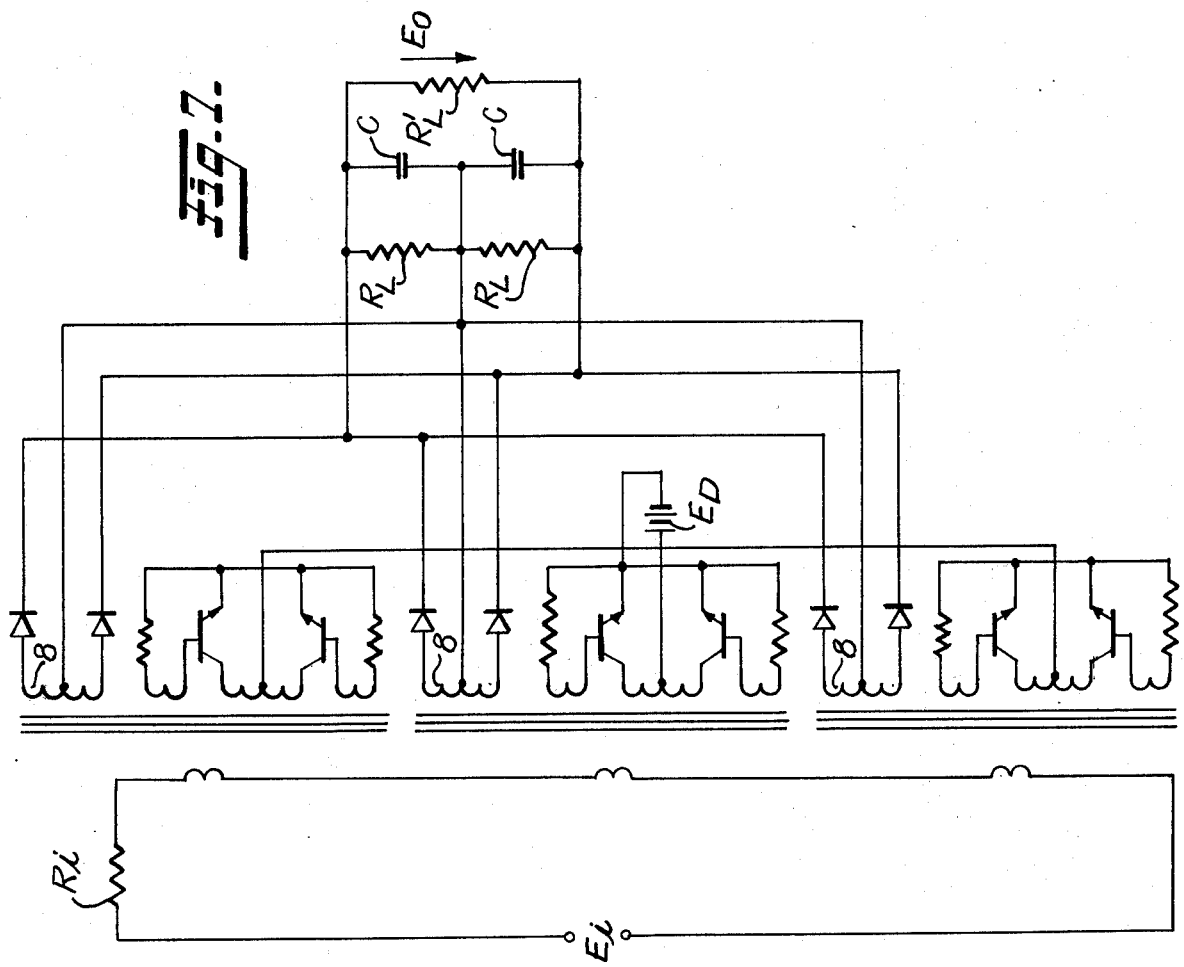
FIG. 7 is a diagram showing another three-phase configuration consisting of three isolated circuits.

In the circuits shown in FIGS. 1 and 4, the D.C. supply and the output must have different grounds. Therefore, in order to have a common ground, the isolation of the output circuit may be necessary. Thus, in the embodiment of the invention shown in FIG. 6, the output circuit of a single core is isolated so that it may include another winding 8. The three-phase configuration in FIG. 7 (which corresponds to FIG. 4) is also composed of three isolated single core circuits of the type shown in FIG. 6. The push-pull characteristic is attained as a consequence of the non-linear characteristic of the diodes in the output circuit. When the condenser C connected in the load circuit has a sufficient capacitance, a considerable gain will be attained.

As apparent from the foregoing, the magnetic signal mixing amplifier of the present invention has various distinctive advantages as an adding amplifier, e.g. excellent linearity, quick response and operation with a d.c. source.

What is claimed is:

1. A linear magnetic signal mixing amplifier for amplifying multiple signals at different levels of potential comprising, a saturable core having a rectangular magnetization characteristic; an input coil on said core for receiving multiple DC input current signals at different levels of potential; output circuit means including an output coil on said core for producing an output voltage proportional to the magnitude of the magne-motive force produced by said input current signals; said output circuit means and output coil being wholly electrically isolated from said input coil; feed back oscillator circuit means including a coil on said core and transistor circuit means for producing an oscillatory voltage in said coil, said coil being in opposition to the output circuit coil so that there is a difference between the mean values of the positive and negative half waves of the oscillatory voltage produced by the oscillating circuit, said oscillator circuit means and coil being wholly electrically isolated from both said input coil and output circuit means; and said difference between said positive and negative half waves being detected as the output of said output circuit means.

2. An amplifier according to claim 1 which further includes, second and third saturable cores separate from and like said first mentioned core; second and third input coils like said first mentioned input coil and on said second and third saturable cores respectively; second and third output coils on said second and third cores, respectively; second and third oscillator circuit means like said first mentioned oscillator circuit means and each including a coil on said second and third saturable cores respectively, said oscillator circuit means each including a control circuit; means connecting the respective output coils to common output circuit means; means series connecting the respective input coils to receive said D.C. input signals serially through the coils; said input coils, output circuit means, and oscillator circuit means being wholly electrically isolated from each other; and means interconnecting the respective oscillator circuit means to enable the oscillating voltages to cancel each other in the control circuits of the oscillators to avoid oscillator loading so that the amplifier linearity is indpendent of input circuit impedance.

* * * * *